United States Patent
Lee et al.

(10) Patent No.: US 10,061,211 B2
(45) Date of Patent: Aug. 28, 2018

(54) METHOD FOR LAYOUTLESS OVERLAY CONTROL

(71) Applicant: Taiwan Semiconductor Manufacturing Co., Ltd., Hsin-Chu (TW)

(72) Inventors: Yung-Yao Lee, Zhubei (TW); Yi-Ping Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 15/413,737

(22) Filed: Jan. 24, 2017

(65) Prior Publication Data

US 2017/0235233 A1     Aug. 17, 2017

Related U.S. Application Data (60) Provisional application No. 62/296,367, filed on Feb. 17, 2016.

(51) Int. Cl.
  *G03B 27/32* (2006.01)
  *G03F 7/20* (2006.01)
  *G03F 9/00* (2006.01)

(52) U.S. Cl.
  CPC ........ *G03F 7/70633* (2013.01); *G03F 9/7003* (2013.01)

(58) Field of Classification Search
  CPC .............................. G03F 7/70633; G03F 9/7003
  See application file for complete search history.

(56) References Cited

U.S. PATENT DOCUMENTS

| | | | |
|---|---|---|---|
| 6,251,745 B1 | 6/2001 | Yu | |
| 7,586,609 B2 | 9/2009 | Lin et al. | |
| 9,158,209 B2 | 10/2015 | Chen et al. | |
| 9,625,831 B1* | 4/2017 | Segawa | ............... G03F 7/70616 |
| 2008/0286885 A1* | 11/2008 | Izikson | .................. G05B 21/02 |
| | | | 438/7 |
| 2012/0216294 A1 | 8/2012 | Hahn et al. | |
| 2013/0259358 A1 | 10/2013 | Chen et al. | |
| 2014/0240703 A1 | 8/2014 | Lee et al. | |

(Continued)

OTHER PUBLICATIONS

Chien, et al. "UNISON Analysis to Model and Reduce Step-and-Scan Overlay Errors for Semiconductor Manufacturing," J Intell Manuf (2011) 22:399-412, published Jul. 30, 2009.

*Primary Examiner* — Peter B Kim
(74) *Attorney, Agent, or Firm* — Eschweiler & Potashnik, LLC (57) ABSTRACT

A method for layoutless overlay control is provided. In some embodiments, a target layer covering a workpiece is patterned using a reticle. The patterning forms a plurality of exposure fields arranged according to a first exposure field layout. Alignment of the exposure fields relative to the workpiece is measured to generate displacement vectors. An inter-field model and an intra-field model are trained using the displacement vectors and a reference field layout. The intra-field model is transformed for use with a second exposure field layout, where the second exposure field layout is different than the first exposure field layout. Overlay corrections are generated based on the trained inter-field model and the transformed intra-field model.

20 Claims, 7 Drawing Sheets

(56) References Cited

U.S. PATENT DOCUMENTS

| | | |
|---|---|---|
| 2014/0278213 A1 | 9/2014 | Hsieh et al. |
| 2015/0015870 A1 | 1/2015 | Lin et al. |
| 2015/0016943 A1 | 1/2015 | Hsieh et al. |
| 2015/0170904 A1 | 6/2015 | Tsen et al. |
| 2016/0240443 A1 | 8/2016 | Lee et al. |
| 2017/0192363 A1 | 7/2017 | Yao |

\* cited by examiner

METHOD FOR LAYOUTLESS OVERLAY CONTROL

REFERENCE TO RELATED APPLICATION

This application claims the benefit of U.S. Provisional Application No. 62/296,367, filed on Feb. 17, 2016, the contents of which are incorporated by reference in their entirety.

BACKGROUND

Photolithography is a process for transferring a pattern from a reticle to a workpiece using radiation, and is repeatedly performed during the manufacture of an integrated circuit (IC). Further, photolithography comprises overlay control, which is a process for aligning the reticle to the workpiece by minimizing overlay variability between first alignment structures of the workpiece and second alignment structures of the reticle. Contributors to overlay variability include, for example, distortion of the workpiece and a tool calibration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an alignment structure) may be referred to as a "first" element in some embodiments, the element may be referred to as a "second" element in other embodiments.

A scanner is a process tool for carrying out photolithography. The scanner repeatedly exposes a photosensitive layer coating a workpiece (e.g., a wafer) to a reticle pattern, while the workpiece is stepped or moved according to an exposure field layout, to define exposure fields arranged on the workpiece according to the exposure field layout. For each exposure, the workpiece is stepped or moved to a new exposure location and the reticle pattern is scanned across the new exposure location. To maintain proper alignment between the reticle pattern and the workpiece, overlay corrections may be generated by overlay control and applied to equipment parameters of the scanner.

According to an approach for overlay control, overlay error is measured at a plurality of sampling locations across the workpiece. The measurements are then used to train an inter-field model and an intra-field model. The inter-field model and the intra-field model describe the relationship between overlay error and overlay factors (e.g., workpiece rotation or asymmetric reticle magnification), and are trained to determine values of the overlay factors. The overlay factors correspond to the equipment parameters of the scanner, such that the values of the overlay factors may be used as or to determine the overlay corrections.

A challenge with the foregoing approach to overlay control is that the overlay corrections are specific to an exposure field layout. Further, the scanner may be used with multiple exposure field layouts. Therefore, separate overlay corrections are maintained for each exposure field layout. However, the overlay corrections for an exposure field layout are only updated when the exposure field layout is used. While this may lead to good overlay control when an exposure field layout is used successively without intervening exposure field layouts, it may lead to poor overlay control when alternating between different exposure field layouts. For example, the overlay corrections of an exposure field layout may become stale while using other exposure field layouts since the scanner may drift out of calibration.

In view of the foregoing, various embodiments of the present application provide a method for layoutless overlay control. In some embodiments, a target layer covering a workpiece is patterned. The patterning forms a plurality of exposure fields arranged according to a first exposure field layout. Alignment of the exposure fields relative to the workpiece is measured to generate displacement vectors. An inter-field model and an intra-field model are trained using the displacement vectors and a reference field layout. The intra-field model is transformed for use with a second exposure field layout, where the second exposure field layout is different than the first exposure field layout. Overlay corrections are generated based on the trained inter-field model and the transformed intra-field model.

By transforming the intra-field model for use with the second exposure field layout, the second exposure field layout can advantageously be used with overlay corrections based on the most recent overlay measurements. Further, by training the intra-field model using the reference field layout, the intra-field model is not bound to an exposure field layout and may, for example, advantageously have a fixed field layout. The fixed field layout may, in turn, minimize the number of transformations maintained.

Figure 1:
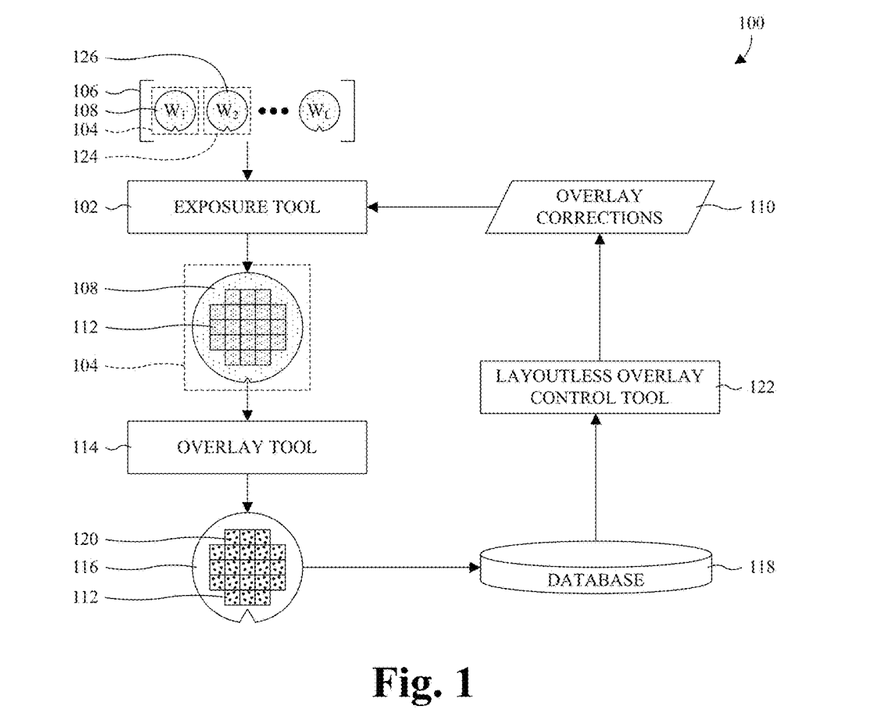
FIG. 1 illustrates a block diagram of some embodiments of a lithography system with layoutless overlay control.

With reference to FIG. 1, a block diagram 100 of some embodiments of a lithography system with layoutless overlay control is provided. As illustrated, an exposure tool 102 is configured to receive a workpiece 104 (e.g., workpiece $W_1$) from a series 106 of workpieces. For clarity, the workpieces of the series 106 are individually labeled $W_1$ through $W_L$, where L is the number of workpieces. The workpiece 104 is covered with a photosensitive layer 108 and comprises first alignment structures (not shown) spread across the workpiece 104.

The exposure tool 102 is further configured to pattern the photosensitive layer 108 using a reticle (not shown) and may be, for example, a stepper or a scanner. The reticle has a reticle pattern and an exposure field layout. Further, the reticle has second alignment structures spread across the reticle and corresponding to the first alignment structures. In some embodiments, the exposure tool 102 is further configured to measure the topography of the photosensitive layer 108 while patterning the photosensitive layer 108 to generate a Z map. The Z map describes the height of the photosensitive layer 108 as a function of location.

To pattern the photosensitive layer 108 using the reticle, the workpiece 104 and the reticle are loaded into the exposure tool 102. The workpiece 104 is then aligned to the reticle by adjusting equipment parameters of the exposure tool 102 based on overlay corrections 110. With the workpiece 104 aligned to the reticle, the photosensitive layer 108 is repeatedly exposed to the reticle pattern while the workpiece 104 is stepped or moved according to the exposure field layout, thereby defining a plurality of exposure fields 112 in the photosensitive layer 108. The exposure fields 112 are arranged according to the exposure field layout, and each have the reticle pattern and the second alignment structures.

An overlay tool 114 is configured to measure and, in some embodiments, estimate overlay error at a plurality of sampling locations on the workpiece 104. In some embodiments, the photosensitive layer 108 is developed before measuring overlay error at the sampling locations. A sampling location is a location at which a first alignment structure and a second alignments structure corresponding to the first alignment structure are located, and overlay error at the sampling location is a displacement vector of misalignment between the first and second alignment structures. In some embodiments where the Z map is generated, the overlay tool 114 is further configured to measure the topography of the photosensitive layer 108, such that the overlay tool 114 generates the Z map instead of the exposure tool 102.

The measured displacement vectors and, in some embodiments, the estimated displacement vectors define a displacement map 116. The displacement map 116 describes overlay error as a function of sampling location, and is stored in a database 118. For clarity, an example of the displacement map 116 is shown with the exposure fields 112 overlaid thereon, as well as a plurality of dots representing displacement vectors 120.

A layoutless overlay control tool 122 is configured to update the overlay corrections 110 using the displacement map 116. In particular, a reference field layout is mapped to the displacement map 116 while ignoring the exposure field layout. The reference field layout is similar to the exposure field layout, except it's not bound to the reticle or any other reticle, such that the layoutless overlay control tool 122 is referred to as "layoutless". A layoutless inter-field model and a layoutless intra-field model are then trained using the displacement map 116 and the reference field layout. In some embodiments, the Z map is further used to train the layoutless inter-field model and the layoutless intra-field model.

The layoutless inter-field model describes the relationship between inter-field overlay error (e.g., workpiece alignment error) and inter-field overlay factors (e.g., workpiece rotation). Similarly, the layoutless intra-field model describes the relationship between intra-field overlay error (e.g., reticle alignment error) and intra-field overlay factors (e.g., asymmetric reticle magnification). Training the layoutless inter-field model and the layoutless intra-field model results in values for the inter-field and intra-field overlay factors and may be performed by, for example, a least squares regression analysis.

With the layoutless inter-field model and the layoutless intra-field model trained, the layoutless intra-field model is transformed into a reticle intra-field model. The reticle intra-field model is a version of the layoutless intra-field model that has been transformed for use with an exposure field layout of a next reticle (not shown) set to be used with the exposure tool 102. Similar to the reticle, the next reticle has a reticle pattern, an exposure field layout, and second alignment structures. The exposure field layout of the next reticle may, for example, be different than the exposure field of the reticle. The transformation may be performed by, for example, transforming the values of the intra-field overlay factors according to a predetermined relationship between the layoutless intra-field model and the reticle intra-field model. Further, in some embodiments, the transformation may be performed using the Z map.

The values of the inter-field overlay factors and the transformed values of the intra-field overlay factors are then used as or to update the overlay corrections 110. Further, the exposure tool 102 uses the next reticle and the overlay corrections 110 to pattern a next workpiece 124 (e.g., workpiece $W_2$) from the series 106 of workpieces, and the foregoing process repeats until the last workpiece (e.g., workpiece $W_L$) in the series 106 of workpieces is processed. Similar to the workpiece 104, the next workpiece 124 is covered with a photosensitive layer 126 and comprises first alignment structures (not shown) corresponding to the second alignment structures of the next reticle.

Advantageously, by using layoutless models, the layoutless overlay control tool 122 updates the overlay corrections 110 for the next workpiece 124 regardless of whether the next reticle has the same or a different exposure field layout as the reticle. For example, supposing the reticle uses exposure field layout A and the next reticle uses exposure field layout B, the overlay corrections 110 are still updated for the next workpiece. Further, updating the overlay corrections 110 in this manner advantageously allows a high degree of overlay control since the overlay corrections 110 are based on the most recent overlay measurements.

The various control and computational functions (e.g., the layoutless modeling and overlay control) described above may be implemented in hardware, software, or a combination of the two in some embodiments. For example, at least some of the control and computational functions may be implemented in an application-specific device (e.g., an application-specific integrated circuit (ASIC)) configured to carry out the functions. As another example, a non-transitory processor readable medium may store processor executable instructions implementing at least some of the control and computational functions, and a processor may be configured to execute the processor executable instructions to carry out the functions.

While the exposure tool 102, the overlay tool 114, and the layoutless overlay control tool 122 are shown as separate tools in FIG. 1, the exposure tool 102, the overlay tool 114, and the layoutless overlay control tool 122 may be integrated in various combinations in some embodiments. For example, the exposure tool 102 may be integrated with the overlay tool 114. Further, while the overlay tool 114 is described as measuring overlay error using the photosensitive layer 108, overlay error may be measured using a layer immediately under the photosensitive layer 108 in other embodiments. For example, a pattern of the photosensitive layer 108 may be transferred to the underlying layer (e.g., by an etch process) and the photosensitive layer 108 may be stripped before measuring overlay error.

Figure 2A:
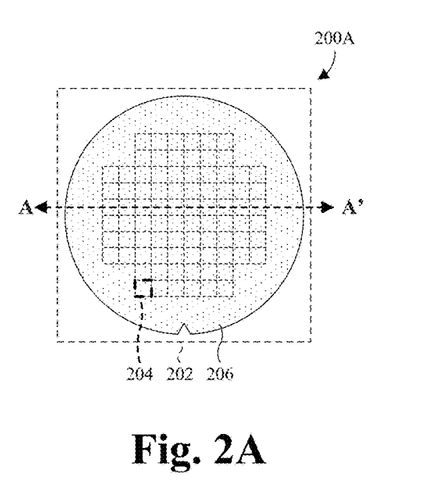
FIGS. 2A and 2B illustrate various views of some embodiments of a workpiece before exposure by an exposure tool of FIG. 1.
Figure 2B:
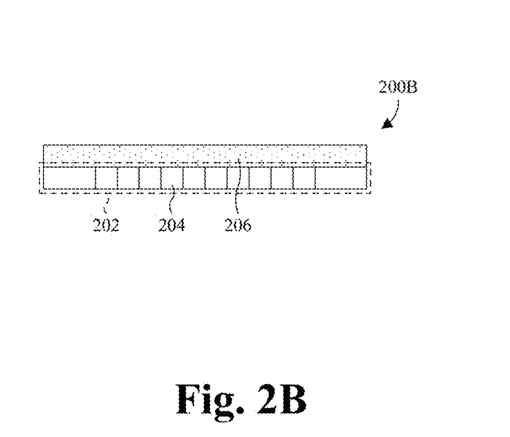

With reference to FIGS. 2A and 2B, various views 200A, 200B of some embodiments of a workpiece 202 before exposure by the exposure tool 102 of FIG. 1 are provided. In particular, FIG. 2A provides a top view 200A of the workpiece 202, and FIG. 2B provides a cross-sectional view 200B of the workpiece 202 taken along line A-A' in FIG. 2A. The workpiece 202 may, for example, be representative of the workpiece 104 of FIG. 1 and/or the next workpiece 124 of FIG. 1. Further, the workpiece 202 may, for example, be representative of each workpiece in the series 106 of workpieces of FIG. 1.

As illustrated, the workpiece 202 comprises multiple integrated circuit (IC) dies 204 under manufacture. The workpiece 202 may, for example, be made up of a semiconductor substrate (not shown), a layer of semiconductor devices (not shown) on or in the semiconductor substrate, layers of dielectric and/or conductive material (not shown) stacked over the semiconductor substrate, or a combination of the foregoing. The semiconductor substrate may be, for example, a bulk wafer of monocrystalline silicon or some other semiconductor, a semiconductor-on-insulator (SOI) wafer, or some other type of wafer. The semiconductor devices may be, for example, transistors, capacitors, image sensors, microelectromechanical systems (MEMS) devices, memory cells, some other type of semiconductor device, or a combination of the foregoing. The layers of dielectric and/or conductive material may, for example, define a back-end-of-line (BEOL) interconnect structure of metal lines and vias covering the semiconductor devices and the semiconductor substrate.

A photosensitive layer 206 is arranged over and covers the workpiece 202, and is used to pattern one or more underlying layers (not shown). For example, the layers of dielectric and/or conductive material may comprise a first BEOL metallization layer bordering the photosensitive layer 206, such that the photosensitive layer 206 may be used to pattern the first BEOL metallization layer. To facilitate patterning of the one or more underlying layers, the photosensitive layer 206 is a photosensitive material that translates patterned radiation (e.g., light) into a physical mask. The photosensitive material may be, for example, photoresist. After translating the patterned radiation into the physical mask, the physical mask may then be used to pattern the one or more underlying layers. For example, an etch may be performed into the one or more underlying layers with the physical mask in place, thereby transferring a pattern of the physical mask to the one or more underlying layers.

Figure 3A:
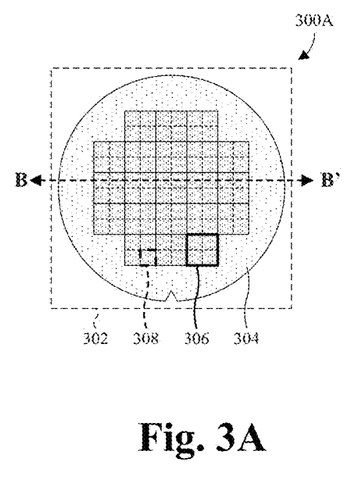
FIGS. 3A and 3B illustrate various views of some embodiments of a workpiece after exposure by an exposure tool of FIG. 1.
Figure 3B:
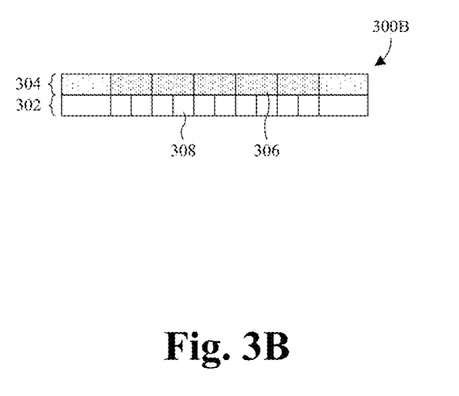

With reference to FIGS. 3A and 3B, various views 300A, 300B of some embodiments of a workpiece 302 after exposure by the exposure tool 102 of FIG. 1 are provided. In particular, FIG. 3A provides a top view 300A of the workpiece 302, and FIG. 3B provides a cross-sectional view 300B of the workpiece 302 taken along line B-B' in FIG. 3A. The workpiece 302 may, for example, be representative of the workpiece 104 of FIG. 1 and/or the next workpiece 124 of FIG. 1. Further, the workpiece 302 may, for example, be representative of each workpiece in the series 106 of workpieces of FIG. 1.

As illustrated, a photosensitive layer 304 covers the workpiece 302 and comprises a plurality of exposure fields 306. The exposure fields 306 are arranged according to an exposure field layout of a reticle used to form the exposure fields 306, and each have a reticle pattern of the reticle. The reticle pattern is not shown in the exposure fields 306 for ease of illustration. In some embodiments, each exposure field 306 covers one or more IC dies 308. For example, each exposure field 306 may cover four IC dies. In other embodiments, each exposure field 306 covers a single IC die, and/or has the same size and/or shape as the single IC die.

Figure 4:
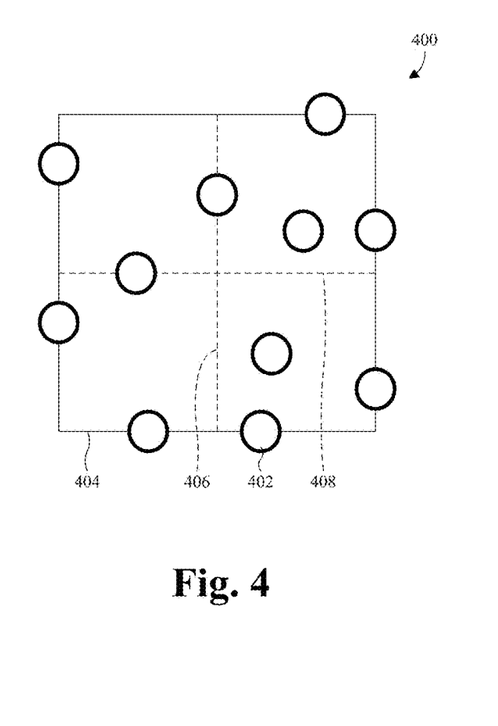
FIG. 4 illustrates some embodiments of a layout of sampling locations for an exposure field of FIG. 1.

With reference to FIG. 4, some embodiments of a layout 400 of sampling locations 402 for an exposure field 404 are provided. The exposure field 404 may, for example, be representative of each of the exposure fields 112 of FIG. 1, such that each of the exposure fields 112 has the same layout of sampling locations.

As illustrated, the layout 400 comprises a plurality of sampling locations 402 spread across the exposure field 404. For example, the layout 400 may comprise 7, 11, or 12 sampling locations. Each of the sampling locations 402 is a location at which a first alignment structure of a workpiece and a second alignment structure of a photosensitive layer are located. In some embodiments, the sampling locations 402 are arranged along a boundary of the exposure field 404, a first centerline 406 of the exposure field 404, a second centerline 408 of the exposure field 404 that is orthogonal to the first centerline 406, or a combination of the foregoing.

While FIG. 4 illustrates a single layout of sampling locations, it is to be appreciated that other layouts of sampling locations are possible. Further, it is to be appreciated that different reticles may produce exposure fields with different layouts of sampling locations. For example, a first reticle may produce exposure fields with a first layout of sampling locations, whereas a second reticle may produce exposure fields with a second layout of sampling locations.

Figure 5:
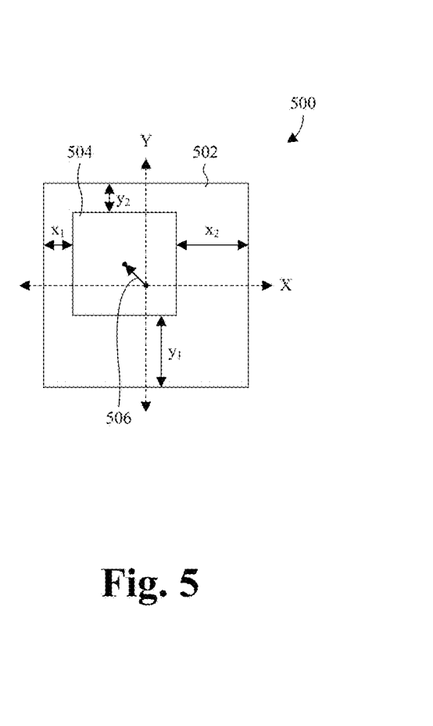
FIG. 5 illustrates a top view of some embodiments of a sampling location within an exposure field of FIG. 1.

With reference to FIG. 5, a top view 500 of some embodiments of a sampling location within the exposure fields 112 of FIG. 1 is provided. The sampling location may, for example, be representative of each of the sampling locations within the exposure fields 112 of FIG. 1. As illustrated, the sampling location comprises a first alignment structure 502 of a workpiece, and further comprises a second alignment structure 504 of a photosensitive layer that covers the workpiece. The first and second alignment structures 502, 504 facilitate measurement of overlay error. In particular, misalignment between the first and second alignment structures 502, 504 may be measured to determine a displacement vector 506 of x and y overlay error.

In some embodiments, the first and second alignment structures 502, 504 are boxes, and the second alignment structure 504 is smaller than and overlaps with the first alignment structure 502. In some of such embodiments, the displacement vector 506 extends from a center of the first alignment structure 502 to a center of the second alignment structure 504. Further, in some of such embodiments, the displacement vector 506 is determined by measuring the displacement between neighboring sidewalls of the first and second alignment structures 502, 504 in the x and y dimensions. For example, displacements $x_1$ and $x_2$ and displacements $y_1$ and $y_2$ may be measured between neighboring sidewalls and used to calculate the displacement vector 506 as $$< \frac{x_1 - x_2}{2}, \frac{y_1 - y_2}{2} >.$$

In other embodiments, the first and second alignment structures 502, 504 have a different structure. For example, the first and second alignment structures 502, 504 may each be made up of one or more gratings, such as two orthogonal gratings.

Figure 6:
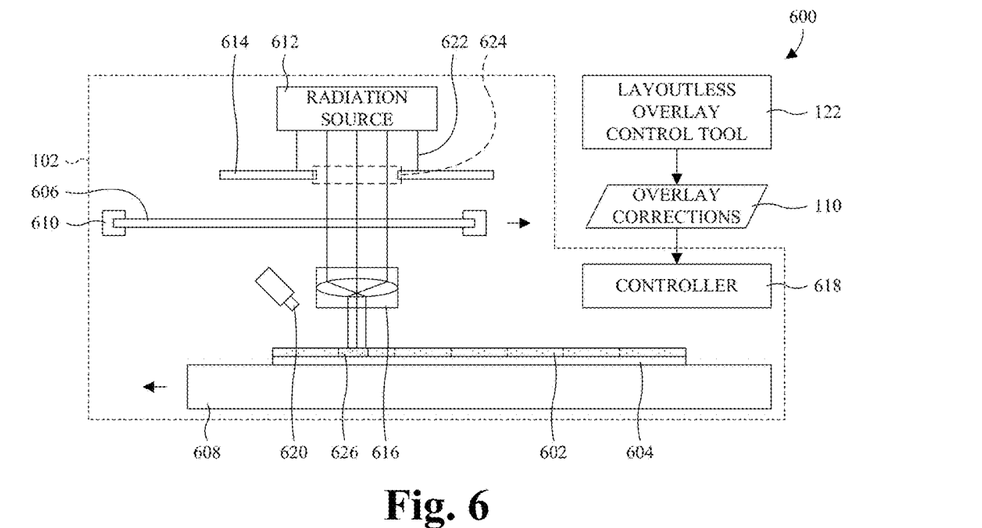
FIG. 6 illustrates a block diagram of some embodiments of an exposure tool of FIG. 1.

With reference to FIG. 6, a block diagram 600 of some embodiments of the exposure tool 102 of FIG. 1 is provided. As illustrated, the exposure tool 102 is a scanner configured to pattern a photosensitive layer 602 covering a workpiece 604 using a reticle 606. The photosensitive layer 602 and the workpiece 604 may be, for example, as described in FIGS. 2A and 2B. The exposure tool 102 comprises a workpiece stage 608, a reticle stage 610, a radiation source 612, a radiation shield 614, a lens 616, and a controller 618. Further, in some embodiments, the exposure tool 102 comprises a metrology module 620.

The workpiece stage 608 supports the workpiece 604 and is configured to move the workpiece 604 laterally. The reticle stage 610 is over the workpiece stage 608 and supports the reticle 606. Further, the reticle stage 610 is configured to move the reticle 606 laterally. The radiation source 612 is configured to generate radiation 622 (e.g., light) that impinges on the photosensitive layer 602 after passing through the reticle 606. The radiation shield 614 is configured to selectively block the radiation 622 before it impinges on the photosensitive layer 602 using an exposure slit 624. The lens 616 is configured to focus the radiation on the photosensitive layer 602. Further, in some embodiments, the lens 616 is configured to reduce and/or collimate the radiation 622. For example, the lens 616 may reduce the area upon which the radiation 622 impinges on the photosensitive layer 602 by 4 or 5 times.

The metrology module 620 is configured to measure overlay error and/or the topography of the photosensitive layer 602. For example, the exposure tool 102 may be integrated with the overlay tool 114 of FIG. 1, such that the metrology module 620 may be configured to measure overlay error and to generate the displacement map 116 of FIG. 1. As another example, the metrology module 620 may be configured to measure the topography of the photosensitive layer and to generate a Z map.

The controller 618 is configured to update equipment parameters of the exposure tool 102 based on overlay corrections 110 from a layoutless overlay control tool 122. Further, the controller 618 is configured to repeatedly expose the photosensitive layer 602 to a reticle pattern of the reticle 606 while the workpiece 604 is stepped or moved according to an exposure field layout of the reticle 606, thereby defining a plurality of exposure fields arranged on the workpiece 604 according to the exposure field layout. In particular, the controller 618 controls the workpiece stage 608 to step between exposure locations according to the exposure field layout. Further, at each exposure location, the controller 618 controls the radiation source 612, the reticle stage 610, and the workpiece stage 608 to transfer the reticle pattern to the exposure location. For example, the controller 618 enables the radiation source 612, and subsequently moves the reticle stage 610 and the workpiece stage 608 in opposite directions to gradually scan the reticle pattern over the exposure location, thereby gradually forming an exposure field 626. Even more, in some embodiments, the controller 618 is configured to control the metrology module 620 to generate the displacement map 116 of FIG. 1 and/or to generate the Z map.

The controller 618 may be implemented in hardware, software, or a combination of the two. In some embodiments, the controller 618 is an ASIC configured to carry out functions of the controller 618. In other embodiments, the controller 618 is made up of a non-transitory processor readable medium and an electronic processor. In such embodiments, the non-transitory processor reasonable medium stores processor executable instructions implementing the functions, and the electronic processor is configured to execute the processor executable instructions to carry out the functions.

Figure 7:
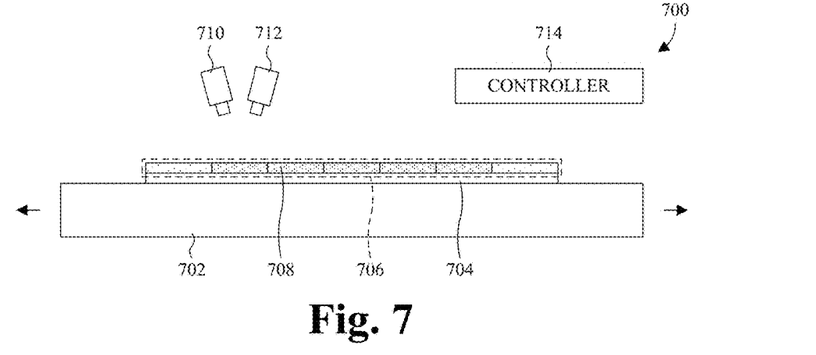
FIG. 7 illustrates a block diagram of some embodiments of an overlay tool of FIG. 1.

With reference to FIG. 7, a block diagram 700 of some embodiments of the overlay tool 114 of FIG. 1 is provided. As illustrated, a workpiece stage 702 supports a workpiece 704 and is configured to move the workpiece 704 laterally. The workpiece 704 is covered by a photosensitive layer 706, and the photosensitive layer 706 comprises a plurality of exposure fields 708. The workpiece 704 and the photosensitive layer 706 may, for example, be as described in FIGS. 3A and 3B.

An overlay metrology module 710 and, in some embodiments, a topography metrology module 712 are over the workpiece 704. The overlay metrology module 710 is configured to measure overlay error between first alignment structures of the workpiece 704 and second alignment structures of the photosensitive layer 706. The overlay metrology module 710 may, for example, use image-based metrology and/or diffraction-based metrology for measurement of overlay error. The first and second alignment structures may, for example, be as shown in FIG. 5. The topography metrology module 712 is configured to measure the topography of the photosensitive layer 706 to generate a Z map. As described in more detailed hereafter, the topography metrology module 712 may, for example, use focused beams of radiation and/or gas press for measurement of topography.

A controller 714 is configured to control the workpiece stage 702 and the overlay metrology module 710 to measure overlay error at sampling locations distributed across the workpiece 704. For example, the controller 714 may control the workpiece stage 702 to move the workpiece 704 between sampling locations. Further, at each sampling location, the controller 714 may control the overlay metrology module 710 to measure overlay error at the sampling location. FIG.

4 provides an example layout of sampling locations for the exposure fields 708. In some embodiments, the controller 714 is further configured to measure only a subset of possible sampling locations and to estimate remaining sampling locations. Even more, in some embodiments, the controller 714 is further configured to control the topography metrology module 712 to generate the Z map while measuring overlay error. The Z map may, for example, be generated with a resolution greater than that of the sampling locations.

The controller 714 may be implemented in hardware, software, or a combination of the two. In some embodiments, the controller 714 is an ASIC configured to carry out functions of the controller 714. In other embodiments, the controller 714 is made up of a non-transitory processor readable medium and an electronic processor. In such embodiments, the non-transitory processor reasonable medium stores processor executable instructions implementing the functions, and the electronic processor is configured to execute the processor executable instructions to carry out the functions.

While the overlay metrology module 710 and the topography metrology module 712 are shown as separate, the overlay metrology module 710 and the topography metrology module 712 may be integrated together in other embodiments. Further, while the overlay tool is shown as being separate from the exposure tool 102 of FIG. 6, the overlay tool may be integrated with the exposure tool 102. For example, the controller 714 may be integrated with the controller 618 of FIG. 6, and the overlay metrology module 710 and the topography metrology module 712 may be integrated into and/or otherwise replace the metrology module 620 of FIG. 6.

Figure 8A:
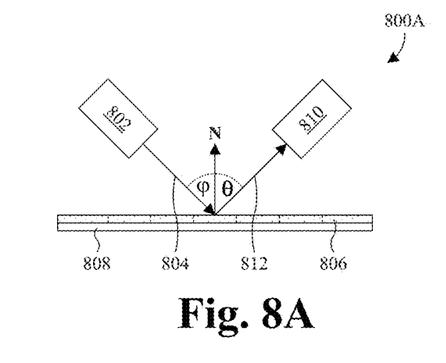
FIGS. 8A and 8B illustrate block diagrams of various embodiments of a metrology module in FIG. 6 and/or FIG. 7.

With reference to FIG. 8A, a block diagram 800A of some embodiments of a metrology module 620, 712 in FIG. 6 and/or FIG. 7 is provided. As illustrated, an emitter 802 is configured to emit an incident beam 804 of focused radiation to a surface of a photosensitive layer 806 at a first angle φ relative to a vector N that is normal to the surface. The photosensitive layer 806 covers a workpiece 808, and the photosensitive layer 806 and the workpiece 808 may, for example, be as described in FIGS. 2A and 2B or FIGS. 3A and 3B. The incident beam 804 is reflected off the surface of the photosensitive layer 806 at a second angle θ to the vector N, and is received by a collector 810. Based on the incident beam 804 and the reflected beam 812, the topography of the photosensitive layer 806 may be measured. For example, the first angle φ and/or the second angle θ may be measured and used to calculate height at the surface.

Figure 8B:
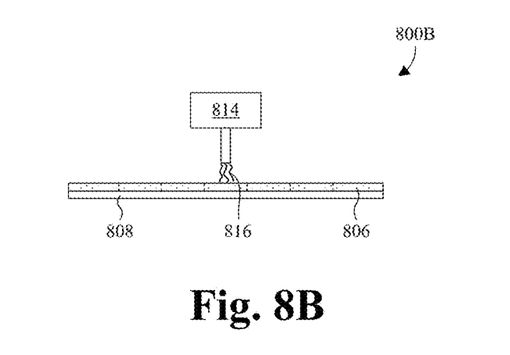

With reference to FIG. 8B, a block diagram 800B of other embodiments of a metrology module 620, 712 in FIG. 6 and/or FIG. 7 is provided. As illustrated, an air gauge 814 is configured to discharge a gas 816 locally onto a surface of a photosensitive layer 806, and to detect a variation in a pressure of the gas 816 as a function of position along the surface. Based on the pressure variation, the topography of the photosensitive layer 806 may be measured.

Figure 9:
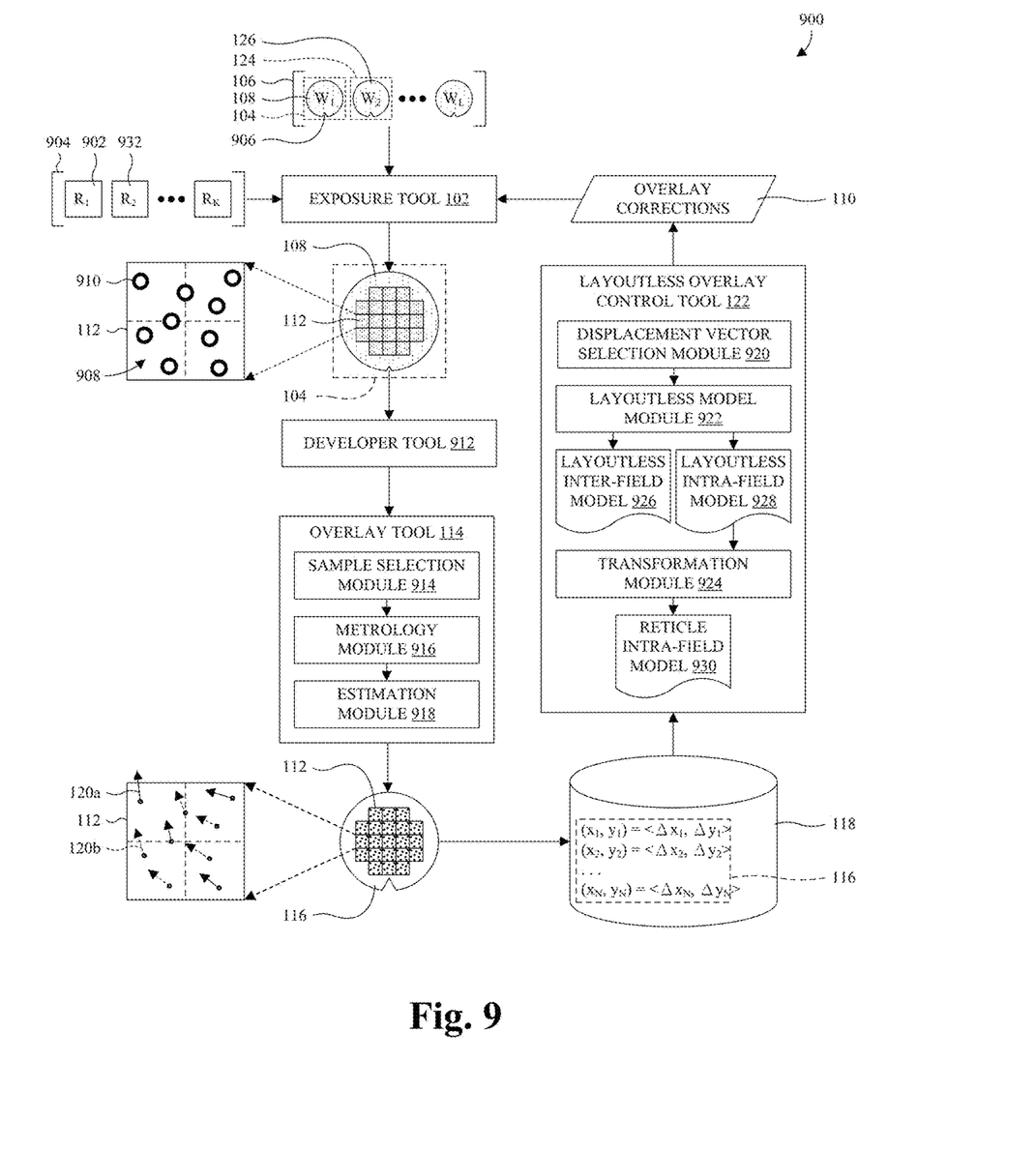
FIG. 9 illustrates a block diagram of some more detailed embodiments of the lithography system of FIG. 1.

With reference to FIG. 9, a block diagram 900 of some more detailed embodiments of the lithography system of FIG. 1 is provided. As illustrated, an exposure tool 102 is configured to receive a workpiece 104 (e.g., workpiece $W_1$) from a series 106 of workpieces. For clarity, the workpieces of the series 106 are individually labeled $W_1$ through $W_L$, where L is the number of workpieces. The workpiece 104 is covered with a photosensitive layer 108 (e.g., a photoresist layer) and comprises first alignment structures (not shown) spread across the workpiece 104. Further, the workpiece 104 may, for example, comprise a semiconductor substrate, semiconductor devices on the semiconductor substrate, layers of dielectric and/or conductive material stacked over the semiconductor substrate, or a combination of the foregoing. An example of the workpiece 104 is shown in FIGS. 2A and 2B.

The exposure tool 102 is further configured to pattern the photosensitive layer 108 using a reticle 902 (e.g., reticle $R_1$) from a set 904 of reticles and may be, for example, a stepper or a scanner. For clarity, the reticles of the set 904 are individually labeled $R_1$ through $R_K$, where K is the number of reticles. The reticle 902 has a reticle pattern and an exposure field layout. Further, the reticle 902 has second alignment structures spread across the reticle 902 and corresponding to the first alignment structures.

To pattern the photosensitive layer 108 using the reticle 902, the workpiece 104 and the reticle 902 are loaded into the exposure tool 102. For example, workpiece $W_1$ and reticle $R_1$ may be loaded into the exposure tool 102. The workpiece 104 is then aligned to the reticle 902. Such alignment comprises coarse alignment and fine alignment. Coarse alignment comprises aligning the workpiece 104 to the reticle 902 using a feature of the workpiece 104, such as, for example, a notch 906 on a side of the workpiece 104. Fine alignment comprises adjusting equipment parameters of the exposure tool 102 based on overlay corrections 110.

With the workpiece 104 aligned, the photosensitive layer 108 is repeatedly exposed to the reticle pattern while the workpiece 104 is stepped or moved according to the exposure field layout, thereby defining a plurality of exposure fields 112 on the workpiece 104. The exposure fields 112 are arranged according to the exposure field layout, and each have the same layout 908 of sampling locations 910. A sampling location is a location at which a first alignment structure and a second alignment structure are located.

For each exposure, the workpiece 104 is stepped or moved to a new exposure location and the photosensitive layer 108 is exposed to the reticle pattern. In particular, radiation (e.g., light) passes through the reticle 902 and selectively impinges on the photosensitive layer 108 according to the reticle pattern, thereby defining one of the exposure fields 112 at the new exposure location. In embodiments where the exposure tool 102 is a stepper, the new exposure location is exposed to the entire reticle pattern at once. In embodiments where the exposure tool 102 is a scanner, the new exposure location is gradually exposed to the reticle pattern while the reticle pattern is scanned across the new exposure location. An example of the workpiece 104 after exposure is shown in FIGS. 3A and 3B.

In some embodiments, the exposure tool 102 is further configured to measure the topography of the photosensitive layer 108 to generate a Z map. The measurements may, for example, be generated while patterning the photosensitive layer 108. The Z map describes the height of the photosensitive layer 108 as a function of location. The height and the location may, for example, be defined in a three-dimensional Cartesian coordinate system with X, Y, and Z dimensions. The X and Y dimensions may, for example, be substantially parallel to a top surface of the photosensitive layer 108, and the Z dimension may, for example, be substantially perpendicular to the top surface. Further, the location may, for example, be defined by x and y coordinates in the X and Y dimensions, and the height may, for example, be defined by a z coordinate in the Z dimension. In some embodiments, the Z map is generated with a resolution greater than a resolution of the sampling locations.

A developer tool 912 is configured to receive the workpiece 104 after exposure, and to develop the photosensitive layer 108. In particular, the developer tool 912 applies a chemical solution (i.e., a developer) to the workpiece 104 to selectively remove material from the photosensitive layer 108 according to the reticle pattern. The developer selectively removes material from the photosensitive layer 108 based on differences in chemical properties between regions of the photosensitive layer 108 upon which radiation impinged and regions of the photosensitive layer 108 upon which radiation did not impinge.

An overlay tool 114 is configured to measure overlay error after development of the photosensitive layer 108. In some embodiments, the overlay tool 114 is further configured to measure the topography of the photosensitive layer 108, such that the overlay tool 114 generates the Z map instead of the exposure tool 102. The overlay tool 114 comprises a sample selection module 914 and a metrology module 916.

The sample selection module 914 is configured to select a set of sampling locations to measure overlay error at. The overlay error at a sampling location is a displacement vector of misalignment between a first alignment structure of the workpiece 104 and a second alignments structure of the photosensitive layer 108. The sampling location and the displacement vector may, for example, be defined in a two-dimensional Cartesian coordinate system with X and Y dimensions. The X and Y dimensions may, for example, be substantially parallel to a top surface of the photosensitive layer 108. Further, the sampling location may, for example, be defined by x and y coordinates in the X and Y dimensions, and the displacement vector may, for example, be defined by x and y displacements in the X and Y dimensions.

The selected sampling locations are spread across the workpiece 104 and may, for example, include multiple sampling locations for each of the exposure fields 112. In some embodiments, all possible sampling locations are selected. In other embodiments, only a subset of possible sampling locations is selected since measuring all possible sampling locations reduces throughput. Further, in some embodiments, at least three sampling locations are selected per exposure field for identifying intra-field overlay error, and/or at least one sampling location is selected per exposure field for identifying inter-field overlay error.

The metrology module 916 is configured to measure overlay error between the first alignment structures and the second alignment structures at the selected sampling locations. In particular, at each of the selected sampling locations, the metrology module 916 measures misalignment between a first alignment structure and a second alignment structure to generate a displacement vector at the sampling location. In some embodiments, the metrology module 916 uses image-based metrology or diffraction-based metrology for measurement. For example, the metrology module 916 may be configured to capture an image of a selected sampling location using a camera, and to analyze the image to determine misalignment between first and second alignment structures. In some embodiments, the metrology module 916 is further configured to measure the topography of the photosensitive layer 108 and to generate the Z map. The Z map may, for example, be made while measuring overlay error.

The displacement vectors 120a measured by the metrology module 916 collectively define a displacement map 116. However, in embodiments where only a subset of possible sampling locations is selected, the displacement map 116 is incomplete. Therefore, in some of such embodiments, the overlay tool 114 comprises an estimation module 918. The estimation module 918 is configured to estimate displacement vectors 120b at the remaining sampling locations to complete the displacement map 116.

In some embodiments, to estimate displacement vectors 120b at the remaining sampling locations, the estimation module 918 trains n model describing the relationship between overlay error and overlay factors, thereby determining values for the overlay factors. The training may, for example, be performed by a least squares regression analysis with the measured displacement vectors 120a. The overlay factors may comprise, for example, workpiece translation, workpiece rotation, workpiece magnification, workpiece non-orthogonality, symmetrical reticle rotation, asymmetrical reticle rotation, symmetrical reticle magnification, asymmetrical reticle magnification, or a combination of the foregoing. With the model trained, displacement vectors 120b may then be estimated at the remaining sampling locations by inputting the remaining sampling locations into the model.

The displacement map 116, whether complete or incomplete, is stored in a database 118. Further, in some embodiments where the Z map is generated, the Z map is stored in the database 118. For clarity, an example of the displacement map 116 is shown with the exposure fields 112 overlaid thereon, as well as an enlarged view of one of the exposure fields 112. The measured displacement vectors 120a are shown by solid arrows, and the estimated displacement vectors 120b are shown by dashed arrows. Further, as shown in the database 118, the displacement map 116 may be stored as a list of N coordinates (e.g., (x, y)) and N measurements (e.g., <$\Delta x$, $\Delta y$>), where N is greater than zero.

A layoutless overlay control tool 122 is configured to update the overlay corrections 110 using the displacement map 116 and, in some embodiments, the Z map. For example, the displacement map 116 and, in some embodiments, the Z map may be used to model the relationship between overlay error and parameters of the overlay corrections 110. The layoutless overlay control tool 122 comprises a displacement vector selection module 920, a layoutless model module 922, and a transformation module 924.

The displacement vector selection module 920 is configured to select a set of displacement vectors from the displacement map 116. In some embodiments, all displacement vectors are selected. In other embodiments, only a subset of possible displacement vectors is selected. For example, only measured displacement vectors 120a are selected. Further, in some embodiments, selecting displacement vectors comprises selecting displacement vectors for identifying intra-field overlay error and selecting displacement vectors for identify inter-field overlay error. For example, a reference field layout may be mapped to the workpiece 104. At least three displacement vectors may then be selected per reference field for identifying intra-field overlay error, and/or at least one displacement vector may be selected per reference field for identify inter-field overlay error.

The reference field layout is made up of reference fields similar to the exposure fields 112. However, the reference field layout may, for example, remain fixed as different exposure field layouts are used with the lithography system. For example, the reference field layout may be fixed to an exposure field layout for a reticle in the set 904 of reticles. Further, the reference field layout may, for example, be independent of the reticles in the set 904 of reticles. The reference fields may, for example, correspond to the exposure fields 112 with a one-to-one correspondence or a one-to-many correspondence. Further, the reference fields may, for example, have a different size and/or shape as the exposure fields 112. Even more, the reference fields may, for example, overlap with and correspond to IC dies of the workpiece 104 with a one-to-one correspondence or a one-to-many correspondence.

The layoutless model module 922 is configured to train a layoutless inter-field model 926 and a layoutless intra-field model 928 using the selected displacement vectors and the reference field layout. The layoutless inter-field model 926 describes the relationship between inter-field overlay error (e.g., workpiece alignment error) and inter-field overlay factors. Examples of inter-field overlay factors include, for example, workpiece translation, workpiece rotation, workpiece magnification, and workpiece non-orthogonality. Similarly, the layoutless intra-field model 928 describes the relationship between intra-field overlay error (e.g., reticle alignment error) and intra-field overlay factors. Examples of intra-field overlay factors include, for example, symmetrical reticle rotation, asymmetrical reticle rotation, symmetrical reticle magnification, and asymmetrical reticle magnification.

In some embodiments, the layoutless inter-field model 926 is defined by the following equations.

$$d_X = T_X - (R_W + N) * Y + M_X * X \quad (1)$$

$$d_Y = T_Y + R_W * X + M_Y * Y \quad (2)$$

As used in Equations (1) and (2), $d_X$ and $d_Y$ are inter-field overlay error in x and y dimensions of an inter-field coordinate system, X and Y are coordinates in the x and y dimensions, $T_X$ and $T_Y$ are workpiece translations in the x and y dimensions, $R_w$ is workpiece rotation, N is workpiece non-orthogonality, and $M_X$ and $M_Y$ are workpiece magnification in the x and y dimensions. The inter-field coordinate system is centered on a center of the workpiece 104 and is a Cartesian coordinate system. Further, the x and y dimensions of the inter-field coordinate system may, for example, be substantially parallel to a top surface of the photosensitive layer 108.

In some embodiments, the layoutless intra-field model 928 is defined by the following equations.

$$d_x = T_X - (R_s + R_a) * y + (M_s + M_a) * x \quad (3)$$

$$d_y = T_Y + (R_s - R_a) * X + (M_s - M_a) * y \quad (4)$$

As used in Equations (3) and (4), $d_x$ and $d_y$ are intra-field overlay error in x and y dimensions of an intra-field coordinate system, x and y are coordinates in the x and y dimensions, $T_X$ and $T_Y$ are reticle translations in the x and y dimensions, $R_s$ and $R_a$ are symmetrical and asymmetrical reticle rotation, $M_s$ and $M_a$ are symmetrical and asymmetrical reticle magnification. The intra-field coordinate system is centered on a center of a reference field and is a Cartesian coordinate system. Further, the x and y dimensions of the intra-field coordinate system may, for example, be substantially parallel to a top surface of the photosensitive layer 108.

To train the layoutless inter-field model 926 and the layoutless intra-field model 928, values are determined for the inter-field overlay factors (e.g., $T_X$, $T_Y$, $R_w$, N, $M_X$, and $M_Y$) and the intra-field overlay factors (e.g., $T_X$, $T_Y$, $R_s$, $R_a$, $M_s$, and $M_a$) that minimize error between estimated overlay error (e.g., $d_X + d_x$ and $d_Y + d_y$) and overlay error of the displacement map 116. In some embodiments, a least squares regression analysis is used to determine values for the inter-field overlay factors and the intra-field overlay factors. For example, Equations (1) and (3) may be added together and Equations (2) and (3) may be added together since the displacement map 116 does not distinguish between inter-field overlay error and intra-field overlay error. Least squares regression may then be performed on the combined equations using the selected displacement vectors and the corresponding locations.

While not shown above, in some embodiments, the layoutless model module 922 is further configured to train the layoutless inter-field model 926 and the layoutless intra-field model 928 using the Z map. For example, Equations (1), (2), (3), and (4) may be updated to account for topography (i.e., to include Z coordinates). During training of the layoutless inter-field model 926 and the layoutless intra-field model 928, the Z coordinates may then be obtained from the Z map using the locations of the selected displacement vectors. Alternatively, in other embodiments, the layoutless model module 922 is configured to train the layoutless inter-field model 926 and the layoutless intra-field model 928 as described above, and then to subsequently apply corrections to the inter-field and intra-field overlay factors using the Z map.

The transformation module 924 is configured to transform the layoutless intra-field model 926 into a reticle intra-field model 930 that is specific to an exposure field layout of a next reticle 932 (e.g., reticle $R_2$) used with the exposure tool 102. As with the reticle 902, the next reticle 932 belongs to the set 904 of reticles, and has a reticle pattern and an exposure field layout. The exposure field layout of the next reticle 932 may, for example, be the same or different than the exposure field layout of the reticle 902. Further, the next reticle 932 has second alignment structures spread across the next reticle 932 and corresponding to first alignment structures of a next workpiece 124. As with the workpiece 104, the next workpiece 124 is covered with a photosensitive layer 126 (e.g., a photoresist layer). An example of the next workpiece 124 is shown in FIGS. 2A and 2B.

To transform the layoutless intra-field model 926 into a reticle intra-field model 930, the values of the intra-field overlay factors are transformed according to a predetermined relationship between the layoutless intra-field model 926 and the reticle intra-field model 930. For example, the values of the intra-field overlay factors may be scaled according to the predetermined relationship. In some embodiments, the predetermined relationship is determined by training the reticle intra-field model 930 and the layoutless intra-field model 926 on the same displacement map, and subsequently comparing the models 926, 930. The reticle intra-field model 930 may, for example, be trained in the same manner described above for the layoutless intra-field model 926 (e.g., using Equations (1)-(4)), except that the exposure field layout of the next reticle 932 is used in place of the reference field layout.

The values of the inter-field overlay factors and the transformed values of the intra-field overlay factors are then used as or to update the overlay corrections 110. Further, the exposure tool 102 uses the next reticle 932 and the overlay corrections 110 to pattern the next workpiece 124, and the foregoing process repeats until the last workpiece (e.g., workpiece $W_L$) in the series 106 of workpieces is processed. For example, the processing may be carried out in the following order: workpiece $W_2$ and reticle $R_2$; workpiece $W_3$ and reticle $R_2$; workpiece $W_4$ and reticle $R_1$; workpiece $W_5$ and reticle $R_K$; and workpiece $W_L$ and reticle $R_2$.

While the foregoing described the overlay tool 114 with the estimation module 918, and the layoutless overlay control tool 122 with the displacement vector selection module 920, the estimation module 918 and the displacement vector selection module 920 may be omitted in some embodiments. In some of such embodiments, the layoutless model module 922 may, for example, use all vectors of the displacement map 116 and/or the sample selection module 914 may, for example, select the sample locations using the reference field layout in place of the exposure field layout of the reticle 902. Further, while the exposure tool 102, the overlay tool 114, and the layoutless overlay control tool 122 are shown as separate tools in FIG. 1, the exposure tool 102, the overlay tool 114, and the layoutless overlay control tool 122 may be integrated in various combinations in some embodiments. Even more, while the overlay tool 114 is described as measuring overlay error using the photosensitive layer 108, overlay error may be measured using a layer immediately under the photosensitive layer 108 in other embodiments.

With reference to FIGS. 10A-10D, block diagrams 1000A-1000D of some embodiments of a method carried by the layoutless overlay control tool 122 of FIGS. 1 and 9 are provided. As illustrated by the block diagram 1000A of FIG. 10A, a first displacement map 1002 is received for a first exposure field layout 1004. The first displacement map 1002 is made up of displacement vectors (not individually labeled), and the first exposure field layout 1004 is made up of first exposure fields 1006. The first exposure field layout 1004 is then removed or otherwise ignored for subsequent acts of the method.

Figure 10A:
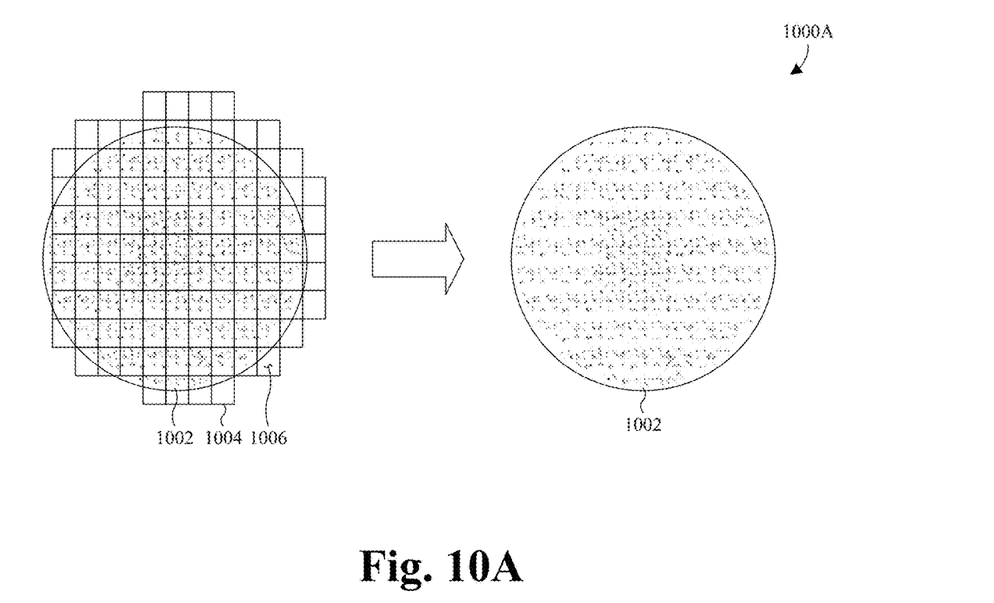
FIGS. 10A-10D illustrate block diagrams of some embodiments of a method carried by a layoutless overlay control tool of FIGS. 1 and 9.
Figure 10B:
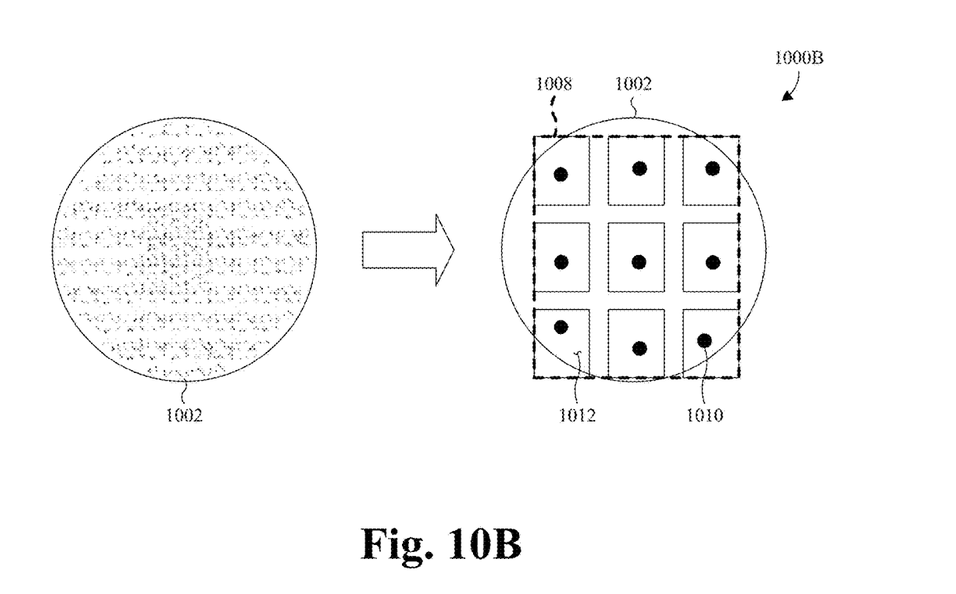

As illustrated by the block diagram of 1000B of FIG. 10B, a reference field layout 1008 is mapped to the first displacement map 1002, and at least one sampling location 1010 is selected from each reference field 1012 for modeling inter-field overlay error. The sampling locations 1010 are locations at which displacement vectors of the first displacement map 1002 are located. In contrast with the first exposure field layout 1004 of FIG. 10A, the reference field layout 1008 is not bound to a reticle. As such, the reference fields 1012 may, for example, have a size and/or a shape that are unrelated to a reticle, and/or may, for example, have a size and/or a shape that are unrelated to that of the first exposure fields 1006.

Figure 10C:
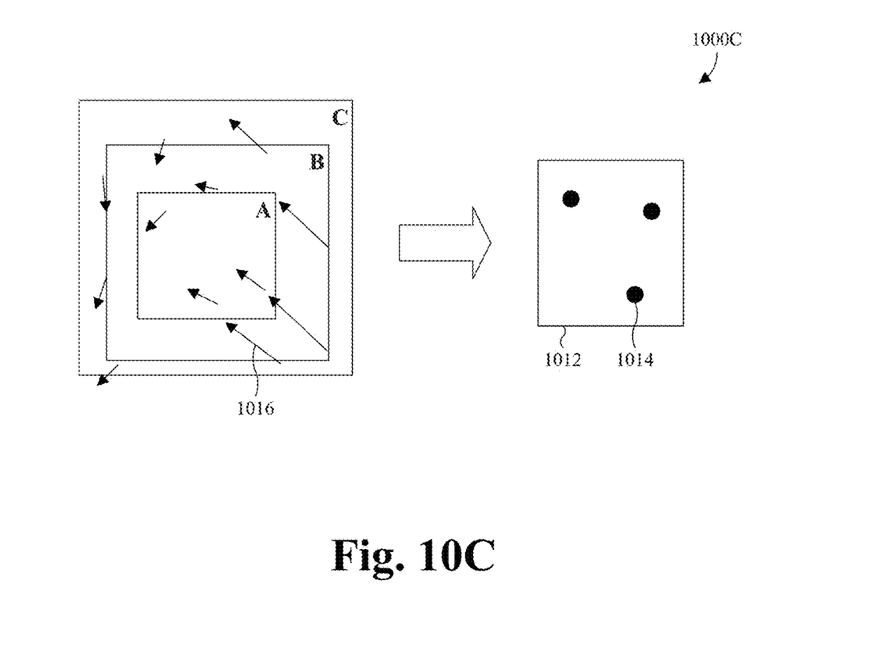

As illustrated by the block diagram of 1000C of FIG. 10C, at least three sampling locations 1014 are selected from each reference field 1012 for modeling intra-field overlay error. As above, the sampling locations 1014 are locations at which displacement vectors 1016 of the first displacement map 1002 are located. Advantageously, in embodiments where the intra-field modeling uses a coordinate system centered on a center of a field, using a reference field 1012 leads to the same coordinate system regardless of exposure field layout. For example, even if the first exposure field layout 1004 of FIG. 10A is made up of exposure field layout A, exposure field layout B, or exposure field layout C, the coordinate system for intra-field modeling is the same.

Figure 10D:
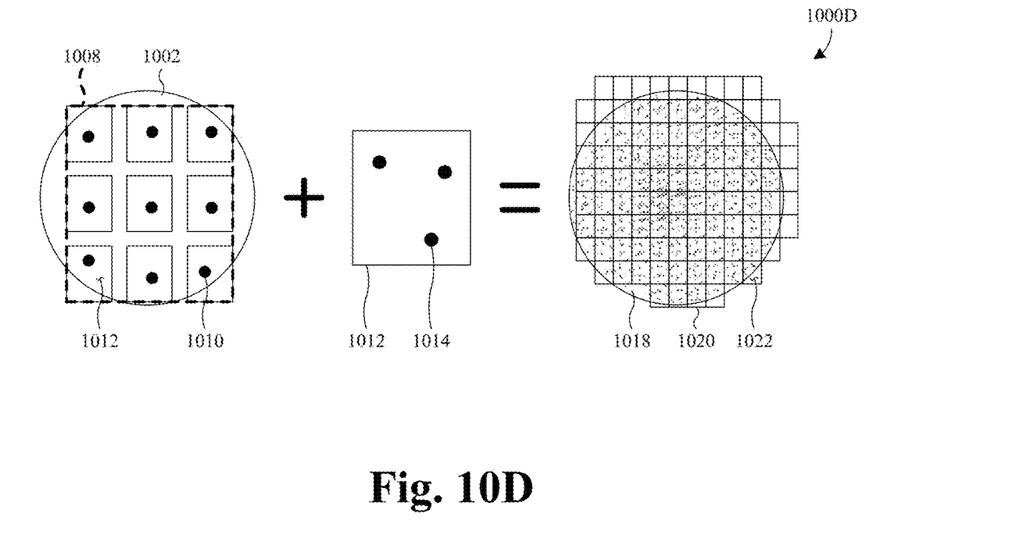

As illustrated by the block diagram 1000D of FIG. 10D, a layoutless inter-field model and a layoutless inter-field model are trained on the selected sampling locations 1010, 1014 and used to predict a second displacement map 1018 for a second exposure field layout 1020. The second displacement map 1018 is made up of displacement vectors (not individually labeled), and the second exposure field layout 1020 is made up of second exposure fields 1022. The first and second exposure field layouts 1004, 1020 may, for example, be the same or different.

In some embodiments, the layoutless intra-field model and the layoutless inter-field model are combined, and subsequently trained using a least squares regression analysis. The layoutless intra-field model is then transformed into a reticle intra-field model for use with the second exposure field layout 1020 based on the known relationship between the layoutless intra-field mod and the reticle intra-field model.

Figure 11:
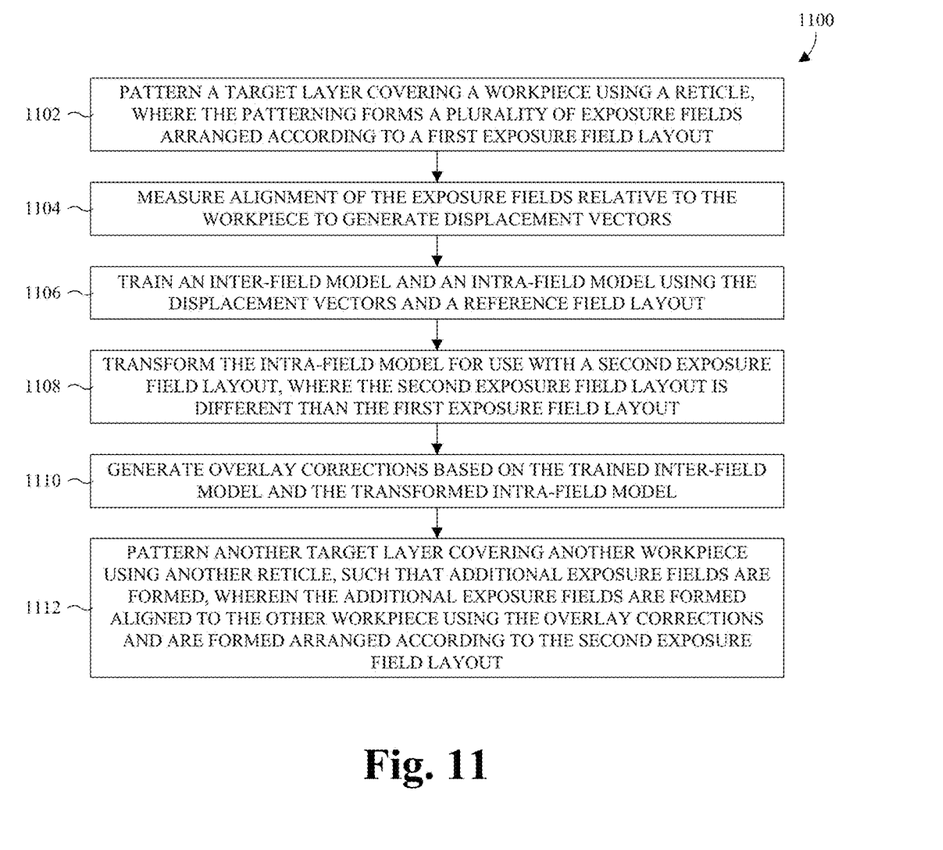
FIG. 11 illustrates a block diagram of some embodiments of a method for layoutless overlay control.

With reference to FIG. 11, a block diagram 1100 of some embodiments of a method for layoutless overlay control is provided. The method may, for example, be performed by the lithography system of FIGS. 1 and 9.

At 1102, a target layer covering a workpiece is patterned using a reticle, where the patterning forms a plurality of exposure fields arranged according to a first exposure field layout. See, for example, FIG. 6 and/or the exposure tool 102 in FIGS. 1 and 9. The target layer may be, for example, a photosensitive layer or a dielectric, semiconductor, or conductive layer to which a pattern of the photosensitive layer has been transferred by an etch process.

At 1104, alignment of the exposure fields relative to the workpiece is measured to generate displacement vectors. See, for example, FIG. 7 and/or the overlay tool 114 in FIGS. 1 and 9. Alignment may be measured using first alignment structures of the workpiece and second alignment structures of the target layer.

At 1106, an inter-field model and an intra-field model are trained using the displacement vectors and a reference field layout. See, for example, the layoutless overlay control tool 122 of FIGS. 1 and 9.

At 1108, the intra-field model is transformed for use with a second exposure field layout, where the second exposure field layout is different than the first exposure field layout. See, for example, the layoutless overlay control tool 122 of FIGS. 1 and 9.

At 1110, overlay corrections are generated based on the trained inter-field model and the transformed intra-field model. See, for example, the layoutless overlay control tool 122 of FIGS. 1 and 9.

At 1112, another target layer covering another workpiece is patterned using another reticle, such that a plurality of additional exposure fields are formed, wherein the additional exposure fields are formed aligned to the other workpiece using the overlay corrections and are formed arranged according to the second exposure field layout While the block diagram 1100 of FIG. 11 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a method for overlay control. A target layer covering a workpiece is patterned using a reticle. The patterning forms a plurality of exposure fields arranged according to a first exposure field layout. Alignment of the exposure fields relative to the workpiece is measured to generate displacement vectors. An inter-field model and an intra-field model are trained using the displacement vectors and a reference field layout. The intra-field model is transformed for use with a second exposure field layout, where the second exposure field layout is different than the first exposure field layout. Overlay corrections are generated based on the trained inter-field model and the transformed intra-field model.

Further, other embodiments of the present application provide a system for overlay control. An exposure tool comprises equipment parameters and is configured to expose a photosensitive layer covering a workpiece to a pattern of a reticle, such that exposure fields are defined in the photosensitive layer according to an exposure field layout of the reticle. Further, the exposure tool is configured to update the equipment parameters based on overlay corrections. An overlay tool is configured to measure overlay error between the exposure field layout and the workpiece to generate overlay error measurements at a plurality of sampling locations spread across the workpiece. An overlay control tool is configured to train an intra-field model and an inter-field model using the overlay error measurements and a reference field layout, and to transform the trained intra-field model for use with a next exposure field layout to be used by the exposure tool. Further, the overlay control tool is configured to update the overlay corrections from the trained inter-field model and the transformed intra-field model. The next exposure field layout is different than the exposure field layout.

Further yet, other embodiments of the present application provide another method for overlay control. A workpiece covered by a photosensitive layer is provided, where the workpiece comprises first alignment structures. The photosensitive layer is patterned using a reticle. The patterning defines a plurality of exposure fields arranged in the photosensitive layer according to a first exposure field layout. Further, the patterning defines second alignment structures corresponding to the first alignment structures in the photosensitive layer. Alignment of the second alignment structures relative to the first alignment structures is measured at a plurality of sampling locations to generate displacement vectors. An inter-field model and an intra-field model are trained using the displacement vectors and a reference field layout. The training generate values for inter-field overlay factors and values for intra-field overlay factors. The values of the intra-field overlay factors are transformed for use with a second exposure field layout different than the first exposure field layout. Overlay corrections are generated based on the values of the inter-field overlay factors and the transformed values of the intra-field overlay factors. Another photosensitive layer is patterned using another reticle and the overlay corrections, such that a plurality of additional exposure fields are defined in the other photosensitive layer and arranged according to the second exposure field layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for overlay control, the method comprising:
   patterning a target layer covering a workpiece using a reticle, wherein the patterning forms a plurality of exposure fields arranged according to a first exposure field layout;
   measuring alignment of the exposure fields relative to the workpiece to generate displacement vectors;
   training an inter-field model and an intra-field model using the displacement vectors and a reference field layout;
   transforming the intra-field model for use with a second exposure field layout, wherein the second exposure field layout is different than the first exposure field layout; and
   generating overlay corrections based on the trained inter-field model and the transformed intra-field model.

2. The method according to claim 1, further comprising:
   patterning another target layer covering another workpiece using another reticle, such that additional exposure fields are formed, wherein the additional exposure fields are formed aligned to the other workpiece using the overlay corrections and are formed arranged according to the second exposure field layout.

3. The method according to claim 1, wherein the workpiece comprises first alignment structures, and wherein the patterning comprises:
   forming second alignment structures corresponding to the first alignment structures in the target layer, wherein the measuring comprises measuring misalignment of the second alignment structures respectively relative to the first alignment structures.

4. The method according to claim 3, wherein the second alignment structures are spread across the exposure fields, and wherein each of the exposure fields has the same number and layout of alignment structures.

5. The method according to claim 1, wherein the patterning comprises:
   repeatedly exposing the workpiece to a pattern of the reticle while the workpiece is stepped according to the first exposure field layout.

6. The method according to claim 1, wherein the intra-field model is trained using a coordinate system centered on a center of a reference field of the reference field layout.

7. The method according to claim 1, wherein the inter-field model defines a relationship between inter-field overlay error and inter-field overlay factors, wherein the intra-field model defines a relationship between intra-field overlay error and intra-field overlay factors, and wherein the training generates values for the inter-field overlay factors and values for the intra-field overlay factors.

8. The method according to claim 7, wherein the inter-field overlay factors comprise workpiece translation, workpiece rotation, workpiece non-orthogonality, and workpiece magnification.

9. The method according to claim 7, wherein the intra-field overlay factors comprise reticle translation, symmetrical reticle rotation, asymmetrical reticle rotation, symmetrical reticle magnification, and asymmetrical reticle rotation.

10. The method according to claim 7, wherein the transforming comprises transforming the values of the intra-field overlay factors for use with the second exposure field layout based on a predetermined relationship between intra-field models respectively of the second exposure field layout and the reference field layout.

11. The method according to claim 1, further comprising:
    forming the target layer covering the workpiece before the patterning, wherein the target layer is formed as photoresist.

12. A system for overlay control, the system comprising:
    an exposure tool comprising equipment parameters, wherein the exposure tool is configured to expose a photosensitive layer covering a workpiece to a pattern of a reticle, such that exposure fields are defined in the photosensitive layer according to an exposure field layout of the reticle, and wherein the exposure tool is further configured to update the equipment parameters based on overlay corrections;

an overlay tool configured to measure overlay error between the exposure field layout and the workpiece to generate overlay error measurements at a plurality of sampling locations spread across the workpiece; and an overlay control tool configured to train an intra-field model and an inter-field model using the overlay error measurements and a reference field layout, to transform the trained intra-field model for use with a next exposure field layout to be used by the exposure tool, and to update the overlay corrections from the trained inter-field model and the transformed intra-field model, wherein the next exposure field layout is different than the exposure field layout.

13. The system according to claim 12, wherein the exposure tool is further configured to expose another photosensitive layer covering another workpiece to a pattern using another reticle, such that other exposure fields are defined in the other photosensitive layer according to the next exposure field layout.

14. The system according to claim 12, wherein the overlay control tool is further configured to train the inter-field and inter-field models using a coordinate system centered on a center of a reference field of the reference field layout.

15. The system according to claim 12, wherein the inter-field model defines a relationship between inter-field overlay error and inter-field overlay factors, wherein the intra-field model defines a relationship between intra-field overlay error and intra-field overlay factors, and wherein the overlay control tool is configured to train the inter-field model and the inter-field model to generate values for the inter-field overlay factors and values for the intra-field overlay factors using regression analysis.

16. The system according to claim 12, wherein the exposure tool is a lithography scanner or a lithography stepper.

17. A method for overlay control, the method comprising:
providing a workpiece covered by a photosensitive layer, wherein the workpiece comprises first alignment structures;

patterning the photosensitive layer using a reticle, wherein the patterning defines a plurality of exposure fields arranged in the photosensitive layer according to a first exposure field layout, and wherein the patterning further defines second alignment structures corresponding to the first alignment structures in the photosensitive layer;

measuring alignment of the second alignment structures relative to the first alignment structures at a plurality of sampling locations to generate displacement vectors;

training an inter-field model and an intra-field model using the displacement vectors and a reference field layout, wherein the training generate values for inter-field overlay factors and values for intra-field overlay factors;

transforming the values of the intra-field overlay factors for use with a second exposure field layout different than the first exposure field layout;

generating overlay corrections based on the values of the inter-field overlay factors and the transformed values of the intra-field overlay factors; and patterning another photosensitive layer using another reticle and the overlay corrections, such that a plurality of additional exposure fields are defined in the other photosensitive layer and arranged according to the second exposure field layout.

18. The method according to claim 17, wherein patterning the photosensitive layer comprises:
repeatedly exposing the workpiece to a pattern of the reticle while the workpiece is stepped according to the first exposure field layout.

19. The method according to claim 18, wherein patterning the photosensitive layer forms each of the exposure fields with the same number and layout of second alignment structures, and wherein the measuring measures alignment at a plurality second alignment structures per exposure field.

20. The method according to claim 17, wherein the training generates the values of the inter-field overlay factors and the values of the intra-field overlay factors using least squares regression analysis.

* * * * *